United States Patent [19]

Sheen

[11] Patent Number: 5,744,397
[45] Date of Patent: Apr. 28, 1998

[54] METHOD OF PLANARIZING AN INSULATING LAYER

[75] Inventor: Dong Sun Sheen, Ichon, Rep. of Korea

[73] Assignee: Hyundai Electronics Industries Co., Ltd., Kyungki-Do, Rep. of Korea

[21] Appl. No.: 771,571

[22] Filed: Dec. 20, 1996

[30] Foreign Application Priority Data

Dec. 23, 1995 [KR] Rep. of Korea ............... 1995-55136

[51] Int. Cl.$^6$ .................................... H01L 21/425
[52] U.S. Cl. ..................... 438/516; 438/92; 438/795
[58] Field of Search ............ 437/17, 173; 148/DIG. 46; 438/516, 795, 972, 151; 250/492.2

[56] References Cited

U.S. PATENT DOCUMENTS

| | | | |
|---|---|---|---|
| 4,116,721 | 9/1978 | Ning et al. .................... | 437/17 |
| 5,254,497 | 10/1993 | Liu .............................. | 438/516 |
| 5,286,978 | 2/1994 | Yoshida et al. ............ | 250/492.21 |
| 5,314,839 | 5/1994 | Tatsumi et al. . | |
| 5,560,778 | 10/1996 | Park et al. .................. | 118/723 E |

*Primary Examiner*—John Niebling
*Assistant Examiner*—Brian K. Dutton
*Attorney, Agent, or Firm*—Fish & Richardson P.C.

[57] ABSTRACT

Disclosed herein is a method of manufacturing a semiconductor device, which comprises steps of forming metal patterns, irradiating an electron beam to electrically neutralize the charge distribution of the metal layer and forming an $O_3$-TEOS layer used for planarization of the interlayer insulating layer.

4 Claims, 3 Drawing Sheets

METHOD OF PLANARIZING AN INSULATING LAYER

BACKGROUND OF THE INVENTION

1. Field of the Invention

The present invention relates to a method of manufacturing a semiconductor device, and more particularly to one which can improve step-coverage of an $O_3$-TEOS layer used for the surface planarization of an interlayer insulating layer in a highly integrated semiconductor device having a multi-level metal layered structure.

2. Description of the Prior Art

Generally, in a highly integrated semiconductor device having a multi-level metal layered structure, a spin-on-glass (SOG) layer or $O_3$-TEOS layer formed by reacting $O_3$ gas and liquefied gas of Tetra-Ethyl-Ortho-Silicate (or Tetra-Ethyl-Oxy-Silane) is mainly used to planarize the interlayer insulating layer. Since the SOG layer is formed by a solution coating method, the SOG layer has excellent gap filling and surface planarization properties. However, the SOG layer contains a large quantity of moisture therein and has a strong hydrophilic property, thus, the reliability of the semiconductor device is reduced. That is, during the manufacturing process, moisture contained in the SOG layer is diffused externally, as a result, the electric characteristics of the device are degraded and cracking of the protection layer results, thereby reducing the reliability of the device.

Since the $O_3$-TEOS layer contains significantly less moisture and has a weakly hydrophilic property, it is possible to overcome the problems due to the moisture. However, the $O_3$-TEOS layer has a disadvantage in that step coverage is poor.

FIGS. 1A through 1C are cross-sectional views of the device for illustrating a conventional method of forming an $O_3$-TEOS layer to planarize the interlayer insulating layer.

Referring to FIG. 1A, on a silicon substrate 1 is formed an insulating layer 2. In order to form a contact hole 8, a portion of the insulating layer 2 is etched until a portion of the silicon substrate 1 is exposed. After a metal layer (not shown) is formed on the insulating layer 2 including the contact hole 8, a first and second lower metal patterns 3A and 3B are formed by etching portions of the metal layer by a plasma etching process using a metal pattern mask. As shown in FIG. 1A, the first lower metal pattern 3A is connected to the silicon substrate 1 through the contact hole 8, but the second lower metal pattern 3B is not connected to the silicon substrate 1.

During a plasma etching process to form the first and second lower metal patterns 3A and 3B, since the silicon substrate 1 is grounded, the first lower metal pattern 3A connected to the silicon substrate 1 is not charged, and the second lower metal pattern 1, which is not connected to the silicon substrate 1, is charged by positive ions of the plasma, therefore, the positive charge is concentrated at the edges of the second lower metal pattern 3B to achieve an equipotential contribution.

Referring to FIG. 1B, an interlayer insulating layer 4 is formed on the insulating layer 2 including the first and second lower metal patterns 3A and 3B, and an $O_3$-TEOS layer 5 is then formed on the interlayer insulating layer 4 by deposition of $O_3$-TEOS silicon dioxide, which is produced by reaction of the $O_3$ and the liquefied gas of TEOS. Molecules of the $O_3$-TEOS silicon dioxide have a negative charge, therefore, molecules of the $O_3$-TEOS silicon dioxide are more attracted to the edges of the second lower metal pattern 3B which is charged by positive ions of the plasma. Consequently, the height of the $O_3$-TEOS layer 5 deposited on the edge portions of the second lower metal pattern 3B is higher than that of the $O_3$-TEOS layer 5 deposited on the center portion of the second lower metal pattern 3B.

For this reason, the thickness of the $O_3$-TEOS layer 5 formed on the second lower metal pattern 3B is not uniform, therefore, the planarization of the surface is degraded, and negative slope is generated.

Referring to FIG. 1C, an upper metal layer 6 is formed on the $O_3$-TEOS layer 5. Since the thickness of the $O_3$-TEOS layer 5 corresponding to the edge portions of the second lower metal pattern 3B is thicker than that of any other portions of the $O_3$-TEOS layer 5, the upper metal layer 6 is not uniformly deposited, and a disconnection portion 6A or thinner portion 6B in the edges of upper metal layer 6 is created.

As mentioned above, in the case of forming the $O_3$-TEOS layer by the prior art method, the thickness of the $O_3$-TEOS layer formed at the edges of the lower metal pattern is thicker than that of the $O_3$-TEOS layer formed at any other portion of the lower metal pattern. Therefore, undesirable step coverage of the $O_3$-TEOS layer occurs, and both edges of the $O_3$-TEOS layer become thinner and are disconnected, thereby reducing the reliability of the device.

SUMMARY OF THE INVENTION

It is, therefore, an object of the present invention to provide a method for manufacturing a semiconductor device, which can improve step-coverage of the $O_3$-TEOS layer to achieve surface planarization of the interlayer insulating layer in a highly integrated semiconductor device having a multi-level metal layered structure.

To achieve this object, a method of manufacturing a device according to the present invention comprises steps of forming metal patterns, electrically neutralizing the charge distribution of metal patterns and forming an $O_3$-TEOS layer used for planarization of the interlayer insulating layer.

BRIEF DESCRIPTION OF THE DRAWINGS

Other objects and advantages of the present invention will be understood by reading the detailed explanation of the embodiment with reference to the accompanying drawings in which.

DETAILED DESCRIPTION OF THE PREFERRED EMBODIMENTS

Figure 1A:
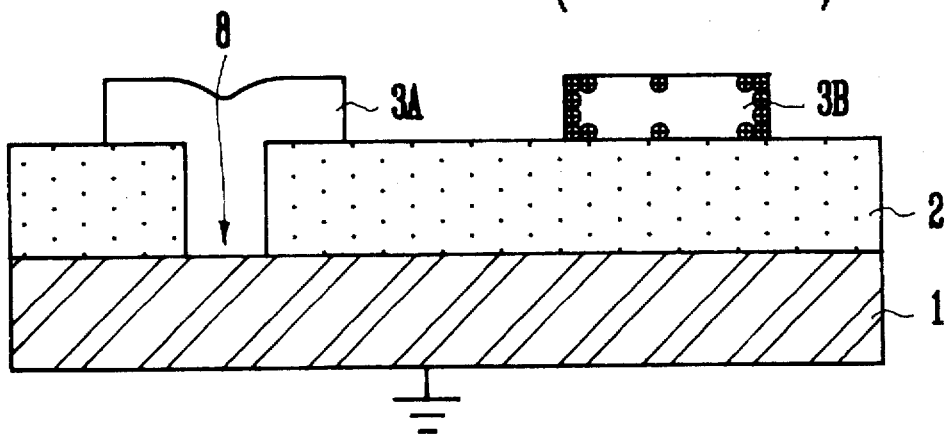
FIGS. 1A through 1C are cross-sectional views of the device for illustrating a conventional method of manufacturing a semiconductor device.
Figure 1B:
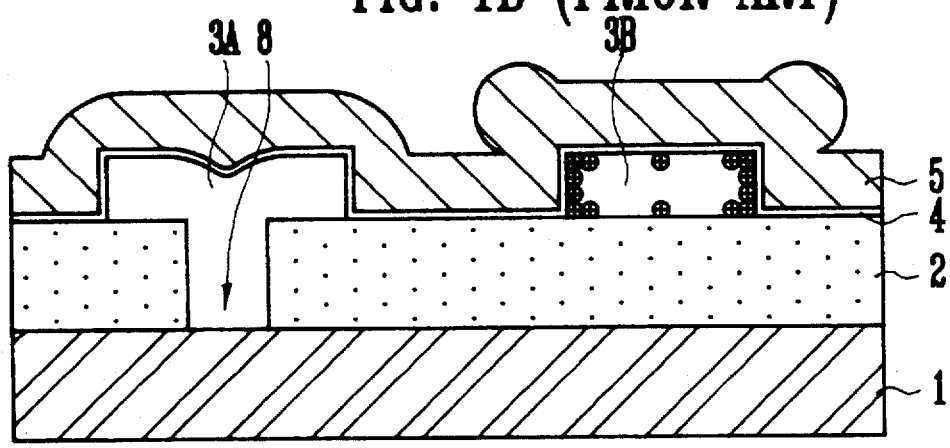
Figure 1C:
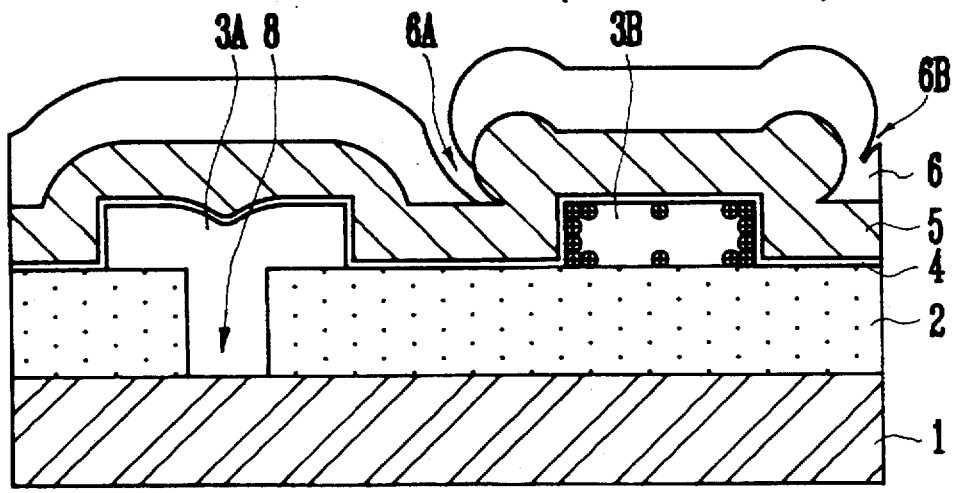
Figure 2A:
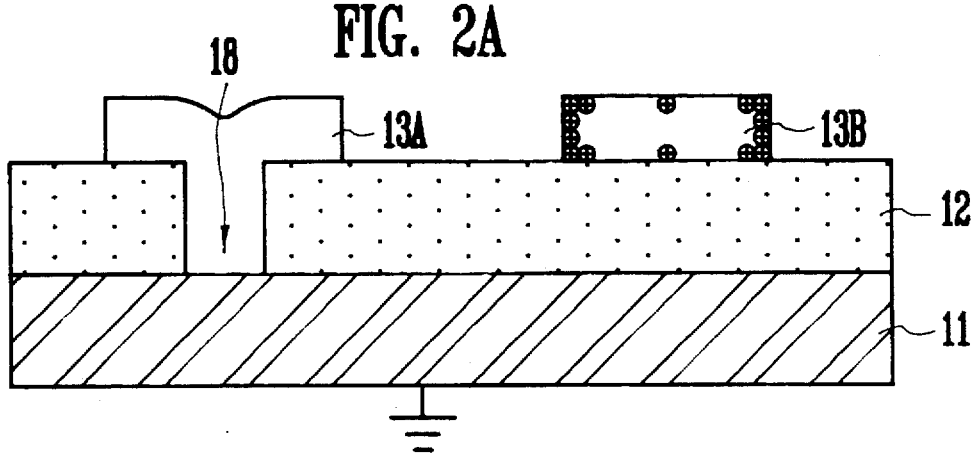
FIGS. 2A through 2C are cross-sectional views of the device for illustrating a method of manufacturing a semiconductor device according to the first embodiment of the present invention.
Figure 2B:
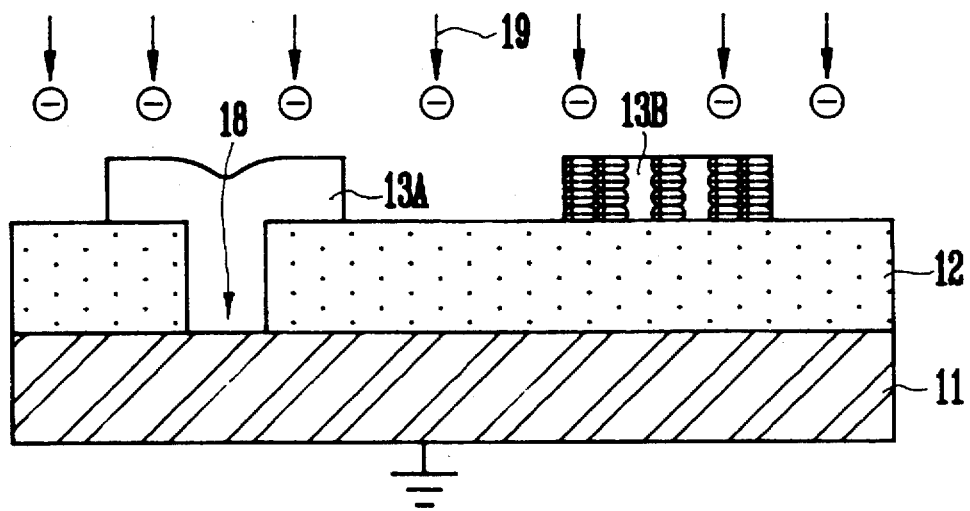
Figure 2C:
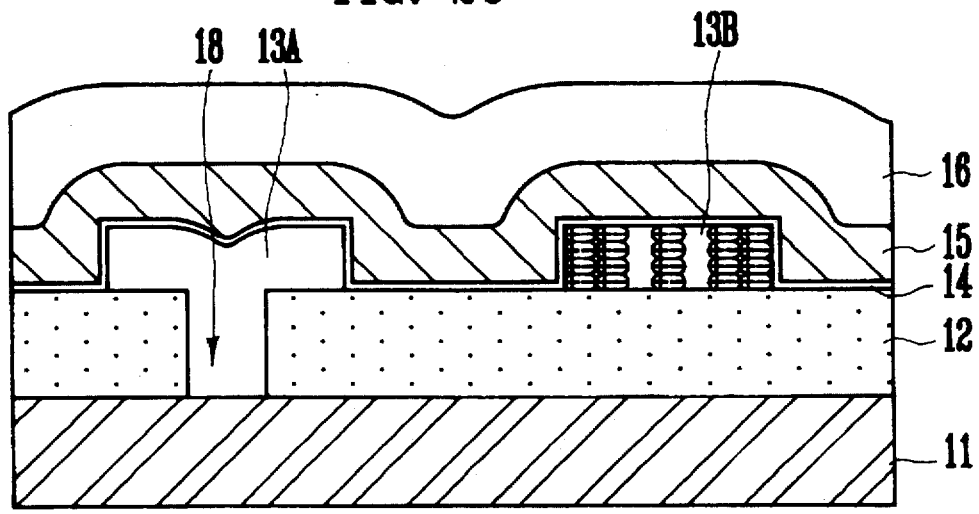

FIGS. 2A to 2C are cross-sectional views for illustrating the method of manufacturing a semiconductor device according to the first embodiment of the present invention.

Referring to FIG. 2A, an insulating layer 12 is formed on a silicon substrate 11. In order to form a contact hole 18, a portion of the insulating layer 12 is etched until a portion of the silicon substrate 11 is exposed. After a lower metal layer (not shown) is formed on the insulating layer 12 including the contact hole 18, a first and second lower metal patterns 13A and 13B are then formed by etching portions of the lower metal layer by a plasma etching process using a metal pattern mask.

As shown in FIG. 2A, the first lower metal pattern 13A is connected to the silicon substrate 11 through the contact hole 18, the second lower metal pattern 13B is not connected to the silicon substrate 11. However, during a plasma etching process to form the first and second lower metal patterns 13A and 13B, since the silicon substrate 11 is grounded, the first lower metal pattern 13A connected to the silicon substrate 11 is not charged, and the second lower metal pattern 13B which is not connected to the silicon substrate 11 is charged by positive ions of the plasma, therefore, the positive charge is concentrated at the edges of the second lower metal pattern 13B to achieve an equipotential contribution.

Referring to FIG. 2B, the electron beam 19 is supplied in a process chamber, therefore, the second lower metal pattern 13B which was charged by positive ions of the plasma becomes electrically neutralized. That is, the electron beam 19 ionizes source gases, and electrons of ionized source gases are irradiated to the first and second lower metal patterns 13A and 13B by the high voltage applied to the process chamber. Electrons penetrating the first lower metal pattern 13A which is connected to the grounded silicon substrate 11 are moved to the ground through the silicon substrate 11, however, the second lower metal pattern 13B which was charged by the positive ions of the plasma becomes electrically neutralized due to the electrons.

The electron beam 19 is immediately supplied in the process chamber after forming the first and second lower metal patterns 13A and 13B, or after cleaning.

Referring to FIG. 2C, an interlayer insulating layer 14 is formed on the insulating layer 12 including the first and second lower metal patterns 13A and 13B. On the interlayer insulating layer 14 is formed an $O_3$-TEOS layer 15. An upper metal layer 16 is formed on the $O_3$-TEOS layer 15. The $O_3$-TEOS layer 15 is formed by deposition of $O_3$-TEOS silicon dioxide which is produced by reaction of the $O_3$ gas and the liquefied gas of TEOS. Molecules of the $O_3$-TEOS silicon dioxide indicate negative charge, therefore, the $O_3$-TEOS silicon dioxide is uniformly deposited on the second lower metal pattern 13B which is in an electrically neutral state. Since the thickness of the $O_3$-TEOS layer 15 formed on the interlayer insulating layer 14 is uniform, the entire thickness of the upper metal layer 16 formed on the $O_3$-TEOS layer 15 is uniform.

Figure 3A:
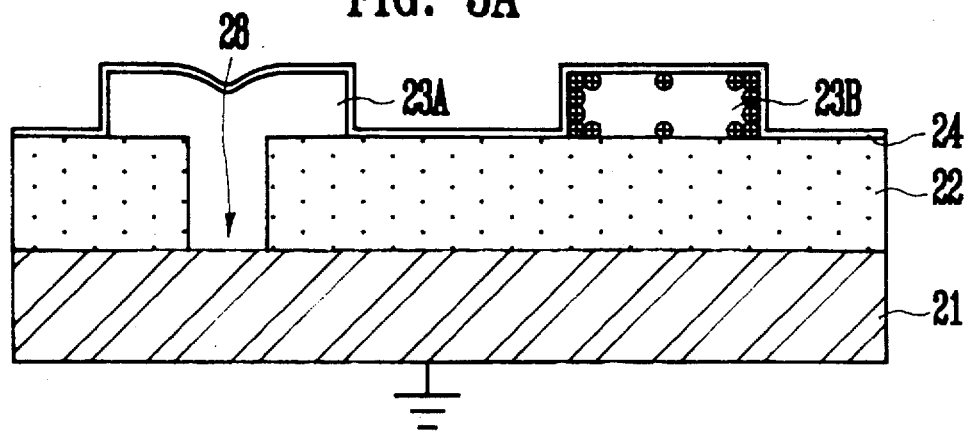
FIGS. 3A through 3C are cross-sectional views of the device for illustrating a method of manufacturing a semiconductor device according to the second embodiment of the present invention.
Figure 3B:
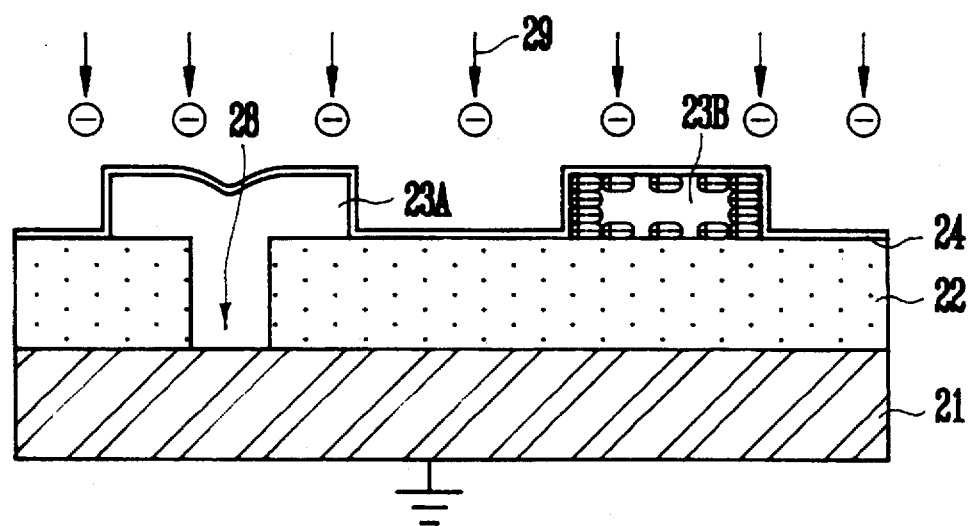
Figure 3C:
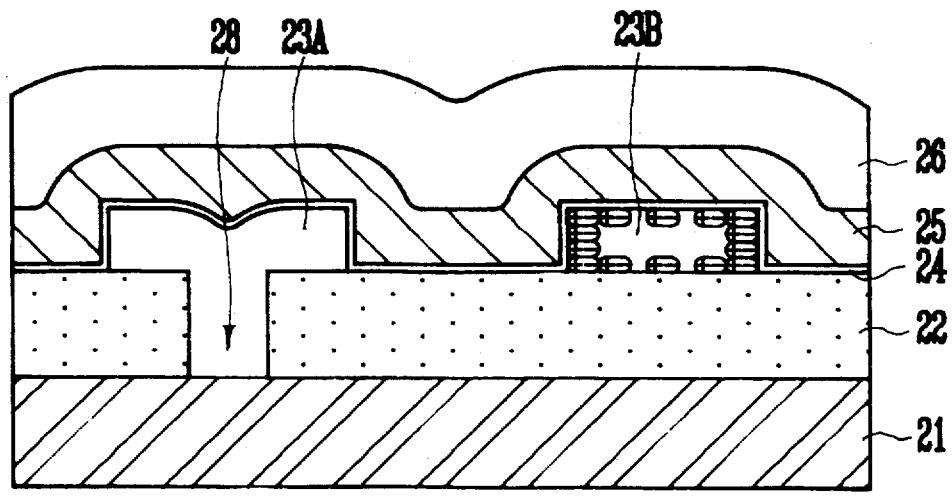

FIGS. 3A to 3C are cross-sectional views for illustrating the method of manufacturing a semiconductor device according to the second embodiment of the present invention.

Referring to FIG. 3A, an insulating layer 22 is formed on a silicon substrate 21. In order to form a contact hole 28, a portion of the insulating layer 22 is etched until a portion of the silicon substrate 21 is exposed. After a lower metal layer (not shown) is formed on the insulating layer 22 including the contact hole 28, a first and second lower metal patterns 23A and 23B are formed by etching a portion of the lower metal layer by a plasma etching process using a metal pattern mask. A interlayer insulating layer 24 is then formed on entire insulating layer 22 including the first and second lower metal patterns 23A and 23B.

As shown in FIG. 3A, the first lower metal pattern 23A is connected to the silicon substrate 21 through the contact hole 28, and the second lower metal pattern 23B is not connected to the silicon substrate 21. However, during a plasma etching process to form the first and second lower metal patterns 23A and 23B, since the silicon substrate 21 is grounded, the first lower metal pattern 23A connected to the silicon substrate 21 is not charged, and the second lower metal pattern 23B which is not connected to the silicon substrate 21 is charged by positive ions of plasma, therefore, the positive charges in the second lower metal pattern 23B are concentrated at edges of the second lower metal pattern 23B to achieve an equipotential contribution.

Referring to FIG. 3B, after forming an interlayer insulating layer 24, an electron beam 29 is supplied in a process chamber, therefore, the second lower metal pattern 23B which was charged by positive ions of the plasma becomes electrically neutralized. That is, the electron beam 29 ionizes source gases, and electrons of ionized source gases are irradiated to the first and second lower metal patterns 23A and 23B by the high voltage applied to the process chamber. Electrons penetrating the first lower metal pattern 23A which is connected to the grounded silicon substrate 21 are moved to the ground through the silicon substrate 21, however, the second lower metal pattern 23B, which was charged by the positive ions of plasma, becomes electrically neutralized due to the electrons.

Referring to FIG. 3C, on the interlayer insulating layer 24 is formed an $O_3$-TEOS layer 25. An upper metal layer 26 is formed on the $O_3$-TEOS layer 25. The $O_3$-TEOS layer 25 is formed by deposition of $O_3$-TEOS silicon dioxide which is produced by reaction of the $O_3$ gas and the liquefied gas of TEOS. Molecules of the $O_3$-TEOS silicon dioxide have a negative charge, therefore, the $O_3$-TEOS silicon dioxide is uniformly deposited on the second lower metal pattern 23B which is in electrically neutral state. Since the thickness of the $O_3$-TEOS layer 25 formed on the interlayer insulating layer 24 is uniform, the entire thickness of the upper metal layer 26 formed on the $O_3$-TEOS layer 25 is uniform.

As described above, the metal patterns, according to the present invention, are electrically neutralized before forming the $O_3$-TEOS layer which is used for the surface planarization of the interlayer insulating layer, therefore, the $O_3$-TEOS layer having a uniform thickness can be formed on the neutralized metal pattern. As a result, the upper metal layer formed on the $O_3$-TEOS layer has an uniform thickness, also this uniformity of thickness can prevent the formation of a thin upper metal pattern, resulting in disconnection of the upper metal pattern. Consequently, the reliability of the semiconductor can be improved, and a more highly integrated device, which requires thinner width, can be achieved.

The foregoing description, although described in its preferred embodiments with a certain degree of particularity, is only illustrative of the principle of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

What is claimed is:

1. A method of manufacturing a semiconductor device comprising the steps of:

forming lower metal patterns on an insulation layer formed on a silicon substrate;

irradiating an electron beam to electrically neutralize the charge distribution in said lower metal patterns;

forming an interlayer insulating layer on said insulation layer including said lower metal patterns; and forming an O$_3$-TEOS layer on said interlayer insulating layer.

2. The method of manufacturing a semiconductor device as claimed in claim 1, wherein said electron beam is irradiated while ground voltage is applied to said silicon substrate.

3. A method of manufacturing a semiconductor device comprising the steps of:

forming lower metal patterns on an insulation layer formed on a silicon substrate;

forming an interlayer insulating layer on said insulation layer including said lower metal patterns;

irradiating an electron beam to electrically neutralize a charge distribution in said lower metal patterns; and forming an O$_3$-TEOS layer on said interlayer insulating layer.

4. The method of manufacturing a semiconductor device as claimed in claim 3, wherein said electron beam is irradiated while ground voltage is applied to said silicon substrate.

* * * * *